(12) United States Patent
Chen et al.

(10) Patent No.: US 11,637,172 B2
(45) Date of Patent: Apr. 25, 2023

(54) SEMICONDUCTOR DEVICE PACKAGES INCLUDING AN INDUCTOR AND A CAPACITOR

(71) Applicant: Advanced Semiconductor Engineering, Inc., Kaohsiung (TW)

(72) Inventors: Chien-Hua Chen, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 83 days.

(21) Appl. No.: 17/083,281

(22) Filed: Oct. 28, 2020

(65) Prior Publication Data

US 2021/0043719 A1 Feb. 11, 2021

Related U.S. Application Data

(63) Continuation of application No. 15/351,265, filed on Nov. 14, 2016, now Pat. No. 10,833,144.

(51) Int. Cl.
*H01L 49/02* (2006.01)
*H01L 23/522* (2006.01)
(Continued)

(52) U.S. Cl.
CPC ............ *H01L 28/10* (2013.01); *H01L 23/522* (2013.01); *H01L 23/5223* (2013.01);
(Continued)

(58) Field of Classification Search
None
See application file for complete search history.

(56) References Cited

U.S. PATENT DOCUMENTS 6,761,963 B2   7/2004   Casper et al.
8,592,311 B2   11/2013  Lin et al.
(Continued)

OTHER PUBLICATIONS

Final Office Action for U.S. Appl. No. 15/351,265, dated Aug. 14, 2019, 25 pgs.
(Continued)

*Primary Examiner* — Erik Kielin
(74) *Attorney, Agent, or Firm* — Foley & Lardner LLP

(57) ABSTRACT

A semiconductor device package includes a substrate, a first patterned conductive layer, a second patterned conductive layer, a dielectric layer, a third patterned conductive layer and a connector. The substrate has a top surface. The first patterned conductive layer is on the top surface of the substrate. The second patterned conductive layer contacts the first patterned conductive layer. The second patterned conductive layer includes a first portion, a second portion and a third portion. The second portion is connected between the first portion and the third portion. The dielectric layer is on the top surface of the substrate. The dielectric layer covers the first patterned conductive layer and surrounds the second portion and the third portion of the second patterned conductive layer. The first portion of the second patterned conductive layer is disposed on the dielectric layer. The third patterned conductive layer is on the second patterned conductive layer, and the connector is directly on the third patterned conductive layer.

14 Claims, 8 Drawing Sheets

(51) Int. Cl.
*H01L 23/64* (2006.01)
*H01L 23/14* (2006.01)
*H01L 23/15* (2006.01)
*H01L 23/00* (2006.01)

(52) U.S. Cl.
CPC ........ *H01L 23/5227* (2013.01); *H01L 23/147* (2013.01); *H01L 23/15* (2013.01); *H01L 23/642* (2013.01); *H01L 23/645* (2013.01); *H01L 24/03* (2013.01); *H01L 24/05* (2013.01); *H01L 24/13* (2013.01); *H01L 2224/0346* (2013.01); *H01L 2224/0362* (2013.01); *H01L 2224/0401* (2013.01); *H01L 2224/05568* (2013.01); *H01L 2224/05647* (2013.01); *H01L 2224/13111* (2013.01); *H01L 2924/14* (2013.01)

(56) References Cited

U.S. PATENT DOCUMENTS

| | | |
|---|---|---|
| 2002/0017730 A1 | 2/2002 | Tahara et al. |
| 2002/0048973 A1 | 4/2002 | Zhou et al. |
| 2002/0102768 A1 | 8/2002 | Shioga et al. |
| 2003/0098767 A1* | 5/2003 | Girardie ............... H01F 41/042 336/200 |
| 2004/0130849 A1 | 7/2004 | Kurihara et al. |
| 2004/0178436 A1 | 9/2004 | Baniecki et al. |
| 2005/0218473 A1 | 10/2005 | Wakisaka |
| 2010/0165585 A1 | 7/2010 | Lin et al. |
| 2011/0304008 A1 | 12/2011 | Yang |
| 2013/0049916 A1* | 2/2013 | Gabrys ............... H01L 23/5227 336/200 |
| 2016/0056105 A1* | 2/2016 | Chan ............... H01L 23/645 257/737 |
| 2017/0077079 A1 | 3/2017 | Lan et al. |

OTHER PUBLICATIONS

Final Office Action for U.S. Appl. No. 15/351,265, dated Oct. 5, 2018, 12 pgs.
Final Office Action for U.S. Appl. No. 15/351,265, dated Oct. 27, 2017, 12 pgs.
Non-Final Office Action for U.S. Appl. No. 15/351,265, dated Mar. 4, 2020, 24 pgs.
Non-Final Office Action for U.S. Appl. No. 15/351,265, dated Apr. 11, 2019, 24 pgs.
Non-Final Office Action for U.S. Appl. No. 15/351,265, dated Apr. 25, 2018, 22 pgs.
U.S. Office Action for U.S. Appl. No. 15/351,265, dated Jul. 7, 2017, 11 pgs.
Notice of Allowance for U.S. Appl. No. 15/351,265, dated Jul. 6, 2020, 10 pgs.

* cited by examiner

SEMICONDUCTOR DEVICE PACKAGES INCLUDING AN INDUCTOR AND A CAPACITOR

CROSS-REFERENCE TO RELATED APPLICATION

This application is a continuation of U.S. patent application Ser. No. 15/351,265 filed Nov. 14, 2016, the contents of which is incorporated herein by reference in its entirety.

BACKGROUND

1. Technical Field

The present disclosure relates to a semiconductor device package. In particular, the present disclosure relates to a semiconductor device package including integrated passive components.

2. Description of the Related Art

A three-dimensional (3D) inductor structure may be formed on a semiconductor substrate, and may be surrounded by a passivation layer. A quality of the 3D inductor structure may be related to a height thereof. Therefore, a 3D inductor structure having a greater height may be desirable; however, increasing a height of the 3D inductor structure is difficult. Additionally, a greater height of the 3D inductor structure and a greater thickness of the passivation layer (e.g., to accommodate the 3D inductor structure of greater height) result in higher cost.

SUMMARY

In an aspect according to some embodiments, a semiconductor device package includes a substrate, a first patterned conductive layer, a second patterned conductive layer, a dielectric layer, a third patterned conductive layer and a connector. The substrate has a top surface. The first patterned conductive layer is on the top surface of the substrate. The second patterned conductive layer contacts the first patterned conductive layer. The second patterned conductive layer includes a first portion, a second portion and a third portion. The second portion is connected between the first portion and the third portion. The dielectric layer is on the top surface of the substrate. The dielectric layer covers the first patterned conductive layer and surrounds the second portion and the third portion of the second patterned conductive layer. The first portion of the second patterned conductive layer is disposed on the dielectric layer. The third patterned conductive layer is on the second patterned conductive layer, and the connector is directly on the third patterned conductive layer.

In an aspect according to some embodiments, a semiconductor device package includes a substrate, a first patterned conductive layer, a dielectric layer, a second patterned conductive layer, a third patterned conductive layer and an encapsulation layer. The substrate has a top surface. The first patterned conductive layer is on the top surface of the substrate. The dielectric layer is on the top surface of the substrate and covers the first patterned conductive layer. The second patterned conductive layer includes a first portion on the dielectric layer, a second portion within the dielectric layer and a third portion within the dielectric layer and contacting the first patterned conductive layer. The third patterned conductive layer is on the second patterned conductive layer. The encapsulation layer is on the dielectric layer and encapsulates the third patterned conductive layer.

In an aspect according to embodiments, a method of manufacturing a semiconductor device package includes providing a substrate; forming a first patterned conductive layer on the substrate; forming a dielectric layer on the first patterned conductive layer and the substrate; removing portions of the dielectric layer to form openings in the dielectric layer; forming a second patterned conductive layer on the dielectric layer and extending into the openings of the dielectric layer; forming a third patterned conductive layer on the second patterned conductive layer; and forming a solder mask layer on the dielectric layer to surround the third patterned conductive layer.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. The techniques are cost effective, and are compatible with forming 3D integrated circuit (IC) packages.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
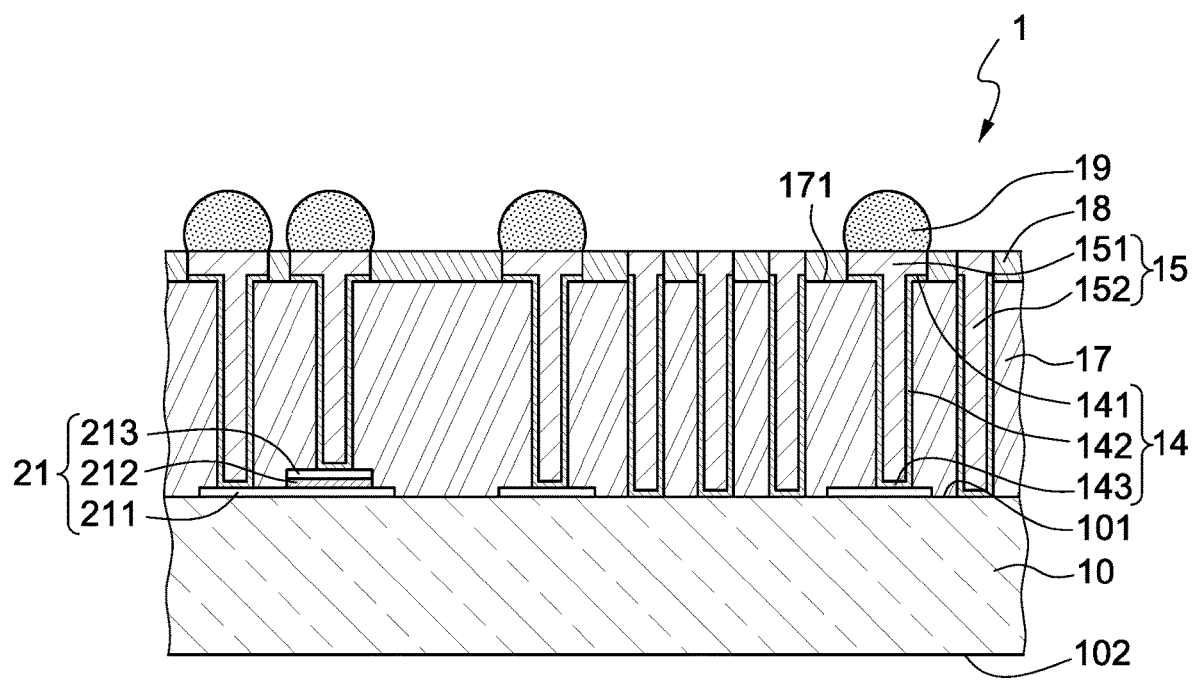
FIG. 1 is a cross-sectional view of a semiconductor device package in accordance with some embodiments of the present disclosure.

FIG. 1 is a cross-sectional view of a semiconductor device package 1 in accordance with some embodiments of the present disclosure. The semiconductor device package 1 includes a substrate 10, patterned conductive layers 211, 213, 14 and 15, a dielectric layer 17, a solder mask layer 18 and connectors 19.

The substrate 10 includes, for example, glass, silicon, silicon dioxide ($SiO_2$), or a combination thereof. The substrate 10 has a top surface 101 and a bottom surface 102. A thickness of the substrate 10 is in a range of about 100 micrometers (μm) to about 300 μm or about 200 μm to about 300 μm. One or more active components (e.g., ICs) may be embedded in the substrate 10. One or more active components may be disposed on the substrate 10. One or more passive components are disposed on the substrate 10, including a metal-insulator-metal (MIM) capacitor 21, which includes the patterned conductive layers 211 and 213 and an insulating layer 212 which are formed on the top surface 101 of the substrate 10.

The patterned conductive layer 211 is disposed on the top surface 101 of the substrate 10. The insulating layer 212 is disposed on the patterned conductive layer 211. The patterned conductive layer 213 is disposed on the insulating layer 212. The patterned conductive layer 14 contacts and is directly disposed on the patterned conductive layer 211. The patterned conductive layer 14 contacts and is directly disposed on the patterned conductive layer 213. The patterned conductive layer 14 includes a first portion 141, a second portion 142 and a third portion 143. The third portion 143 of the patterned conductive layer 14 contacts and is directly disposed on the patterned conductive layer 211 or 213. The patterned conductive layer 14 may be or may include a seed layer to allow formation of the patterned conductive layer 15.

The second portion 142 of the patterned conductive layer 14 is connected between the first portion 141 of the patterned conductive layer 14 and the third portion 143 of the patterned conductive layer 14. In some embodiments, a height (along a direction perpendicular to the top surface 101 of the substrate 10) of the second portion 142 of the patterned conductive layer 14 is in a range of about 30 μm to about 100 μm.

The patterned conductive layers 211, 213 and 14 include, for example, titanium-copper (Ti—Cu) alloy or another suitable metal or metal alloy, or a combination thereof. In some embodiments, a thickness of the patterned conductive layer 14 is about 100 Å or greater.

The dielectric layer 17 is disposed on the top surface 101 of the substrate 10. In some embodiments, the dielectric layer 17 includes a suitable insulating material. For example, the dielectric layer 17 may include, or may be formed from, an exposure-type negative photoresist.

The dielectric layer 17 covers the patterned conductive layers 211 and 213 and surrounds the second portion 142 and the third portion 143 of the patterned conductive layer 14. A corner of a sidewall of the dielectric layer 17 (e.g., adjacent to a top surface 171 of the dielectric layer 17) forms an angle of about 90 degrees. The sidewall of the dielectric layer 17 is oriented at about 90 degrees relative to the top surface 101 of the substrate 10. The first portion 141, the second portion 142 and the third portion 143 of the patterned conductive layer 14 are continuous; for example, the first portion 141, the second portion 142 and the third portion 143 may be integrally formed with one another as a monolithic structure.

The first portion 141 of the patterned conductive layer 14 is disposed on the dielectric layer 17. Each connector 19 contacts and is directly disposed on a first portion 151 of the patterned conductive layer 15. In some embodiments, one or more of the connectors 19 include tin (Sn), another suitable metal or metal alloy, or a combination thereof. In some embodiments, one or more of the connectors 19 include solder.

The patterned conductive layer 15 is disposed on the patterned conductive layer 14. The patterned conductive layer 15 includes the first portion 151 over the dielectric layer 17 and a second portion 152 within the dielectric layer 17. The second portion 152 of the patterned conductive layer 15 has a height in a range of about 30 μm to about 100 μm. The patterned conductive layer 15 includes, for example, Cu, another suitable metal or metal alloy, or a combination thereof. The first portion 151 and the second portion 152 of the patterned conductive layer 15 may be continuous; for example, the first portion 151 and the second portion 152 may be integrally formed with one another as a monolithic structure.

The solder mask layer 18 is disposed on the top surface 171 of the dielectric layer 17 and surrounds the first portion 141 of the patterned conductive layer 14 and the first portion 151 of the patterned conductive layer 15. The solder mask layer 18 may include polypropylene resin or other insulating materials which may be used additionally or alternatively. A top surface of the solder mask layer 18 may be substantially coplanar with a top surface of the first portion 151 of the patterned conductive layer 15.

A relatively greater thickness of the patterned conductive layer 15 can provide improved electrical conductivity, Q factor and inductance. For example, portions of the patterned conductive layer 15 can form a 3D inductor structure.

Figure 2:
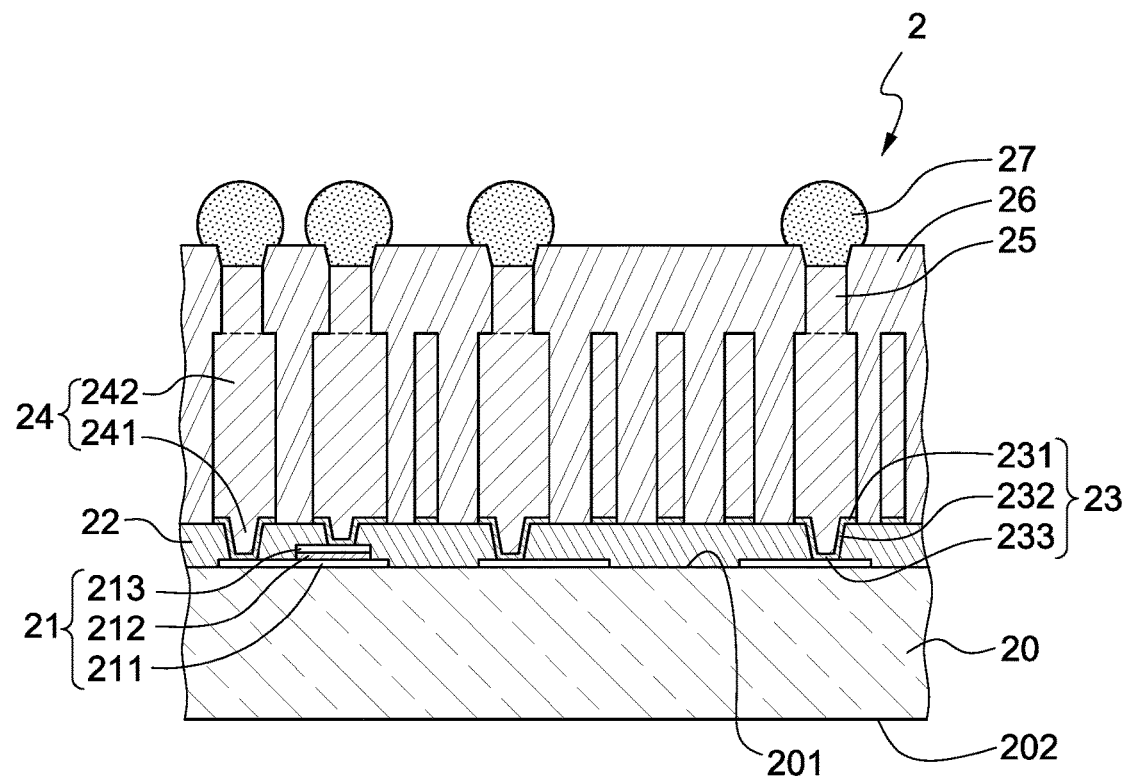
FIG. 2 is a cross-sectional view of a semiconductor device package in accordance with some embodiments of the present disclosure.

FIG. 2 is a cross-sectional view of a semiconductor device package 2 in accordance with some embodiments of the present disclosure. The semiconductor device package 2 includes a substrate 20, patterned conductive layers 211, 213, 23, 24 and 25, a dielectric layer 22, an encapsulation layer 26 and connectors 27.

The substrate 20 includes, for example, glass, silicon, silicon dioxide ($SiO_2$), or a combination thereof. The substrate 20 has a top surface 201 and a bottom surface 202. A thickness of the substrate 20 is in a range of about 100 μm to about 300 μm or about 200 μm to about 300 μm. One or more active components (e.g., ICs) may be embedded in the substrate 20. One or more active components may be disposed on the substrate 20. One or more passive components are disposed on the substrate 20, including a MIM capacitor 21, which includes the patterned conductive layers 211 and 213 and an insulating layer 212 which are formed on the top surface 201 of the substrate 20.

The patterned conductive layer 211 is disposed on the top surface 201 of the substrate 20. The insulating layer 212 is disposed on the patterned conductive layer 211. The patterned conductive layer 213 is disposed on the insulating layer 212. The dielectric layer 22 is disposed on the top surface 201 of the substrate 20 and covers the patterned conductive layers 211 and 213. The dielectric layer 22 includes a suitable insulating material. For example, the dielectric layer 22 may be a passivation layer.

The patterned conductive layer 23 includes a first portion 231 on the dielectric layer 22, a second portion 232 within the dielectric layer 22 and a third portion 233 within the dielectric layer 22. The first portion 231, the second portion 232 and the third portion 233 of the patterned conductive layer 23 may be continuous; for example, the first portion 231, the second portion 232 and the third portion 233 may be integrally formed with one another as a monolithic structure. One or more of the patterned conductive layers 211 and 213 and the patterned conductive layer 23 may include Ti—Cu alloy or another suitable metal or metal alloy, or a combination thereof.

The patterned conductive layer 23 contacts and is directly disposed on the patterned conductive layer 211 or 213. The patterned conductive layer 24 is disposed on the patterned conductive layer 23. The encapsulation layer 26 is disposed on the dielectric layer 22 and encapsulates the patterned conductive layer 24. The encapsulation layer 26 may include polypropylene resin or other insulating materials which may be used additionally or alternatively.

The patterned conductive layer 24 includes a first portion 241 and a second portion 242 over the first portion 241. The first portion 241 of the patterned conductive layer 24 is surrounded by the patterned conductive layer 23, and the second portion 242 of the patterned conductive layer 24 is encapsulated by the encapsulation layer 26.

The second portion 242 of the patterned conductive layer 24 has a height in a range of about 30 μm to about 100 μm. The patterned conductive layer 25 is disposed on the patterned conductive layer 24. The patterned conductive layer 25 has a width (along a direction parallel to the top surface 201 of the substrate 20) smaller than a width of the patterned conductive layer 24. One or more of the patterned conductive layer 24 and the patterned conductive layer 25 include, for example, Cu, another suitable metal or metal alloy, or a combination thereof. The connectors 27 are disposed on the patterned conductive layer 25. Each connector 27 may contact and may be directly disposed on the patterned conductive layer 25. One or more of the connectors 27 include Sn, another suitable metal or metal alloy, or a combination thereof. In some embodiments, one or more of the connectors 27 include solder. The patterned conductive layer 25 is recessed from a top surface of the encapsulation layer 26, and the connectors 27 extend into the encapsulation layer 26.

Figure 3:
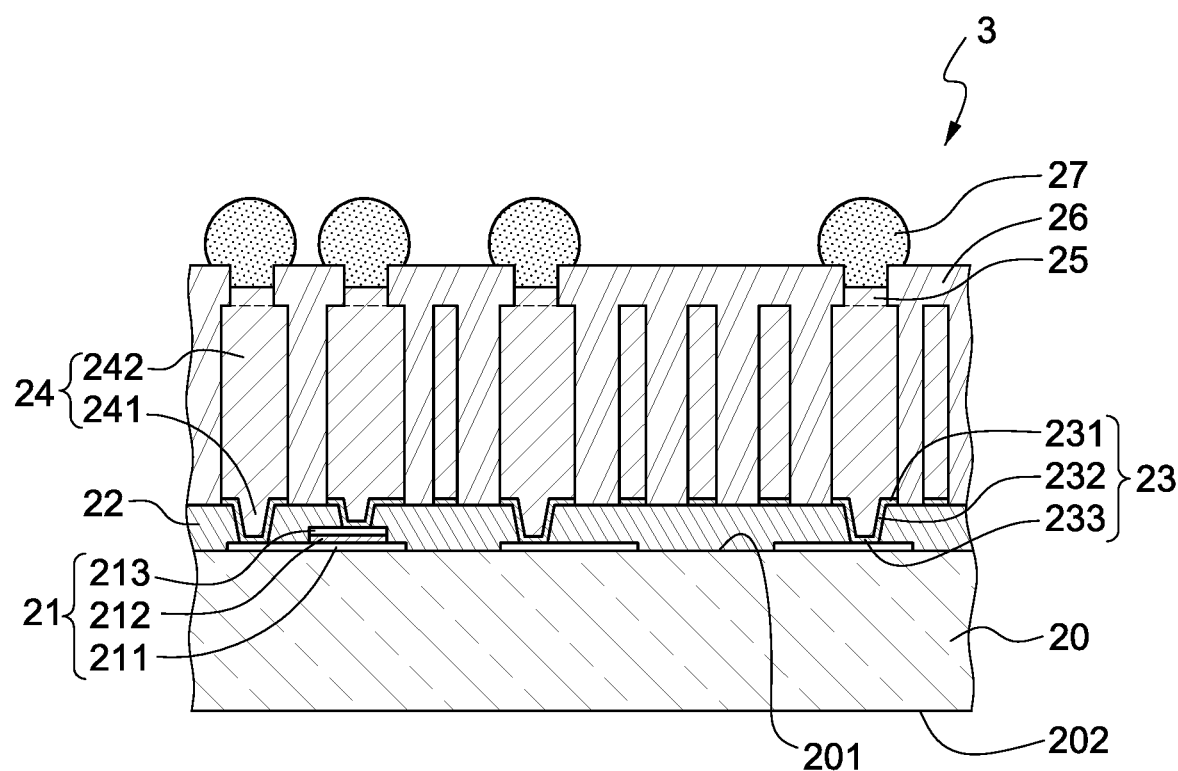
FIG. 3 is a cross-sectional view of a semiconductor device package in accordance with some embodiments of the present disclosure.

FIG. 3 is a cross-sectional view of a semiconductor device package 3 in accordance with some embodiments of the present disclosure. The semiconductor device package 3 is similar in some respects to the semiconductor device package 2 as described and illustrated with reference to FIG. 2, except that a height of the patterned conductive layer 25 of the semiconductor device package 3 is less than a height of the patterned conductive layer 25 of the semiconductor device package 2.

Figure 4:
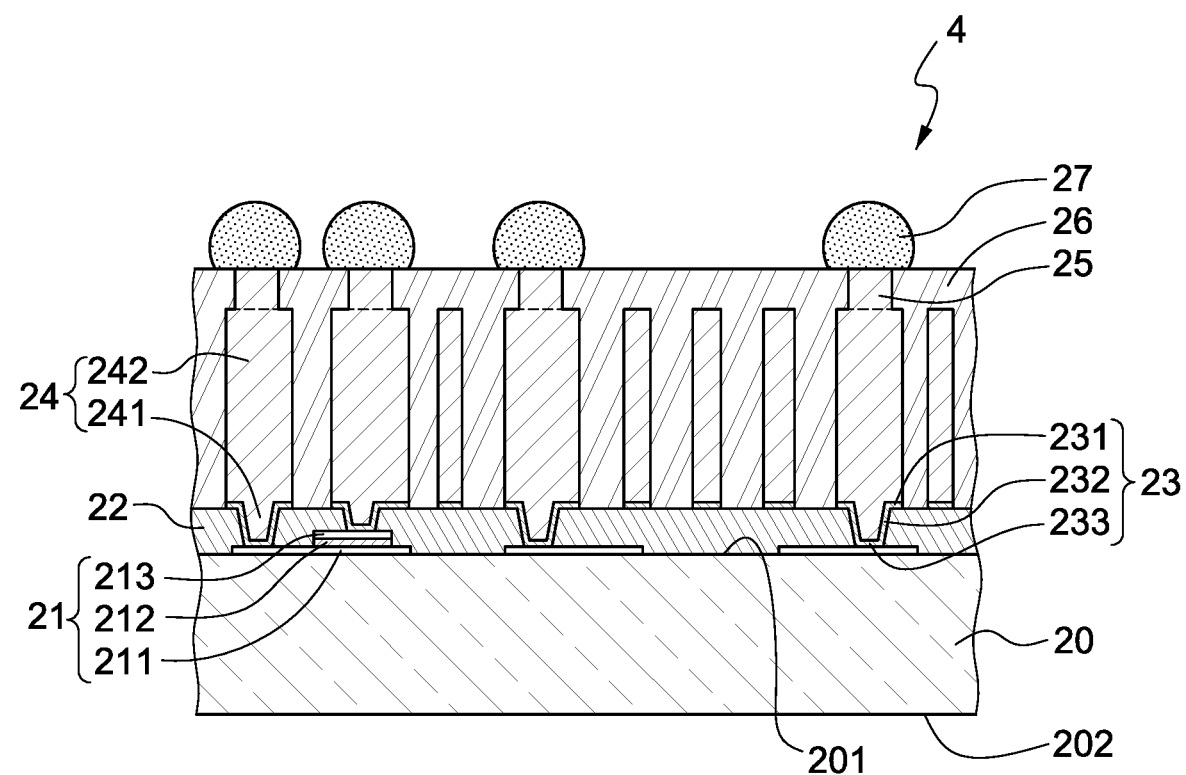
FIG. 4 is a cross-sectional view of a semiconductor device package in accordance with some embodiments of the present disclosure.

FIG. 4 is a cross-sectional view of a semiconductor device package 4 in accordance with some embodiments of the present disclosure. The semiconductor device package 4 is similar in some respects to the semiconductor device package 2 as described and illustrated with reference to FIG. 2, except that a height of the patterned conductive layer 25 of the semiconductor device package 4 is less than the height of the patterned conductive layer 25 of the semiconductor device package 2, and the connectors 27 do not extend into the encapsulation layer 26.

Figure 5A:
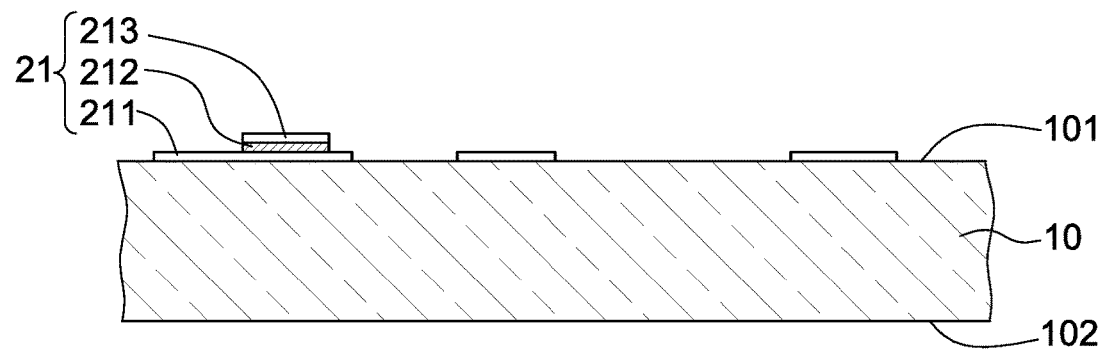
FIG. 5A, FIG. 5B, FIG. 5C, and FIG. 5D illustrate a method of manufacturing a semiconductor device package in accordance with some embodiments of the present disclosure.

FIGS. 5A, 5B, 5C and 5D illustrate a method of manufacturing a semiconductor device package in accordance with some embodiments of the present disclosure. Referring to FIG. 5A, a substrate 10 is provided. The substrate 10 includes one or more of glass, silicon or SiO$_2$. A patterned conductive layer 211 is formed on a top surface 101 of the substrate 10. An insulating layer 212 is formed on a portion of the patterned conductive layer 211. A patterned conductive layer 213 is formed on the insulating layer 212. The insulating layer 212 includes a suitable insulating material.

Figure 5B:
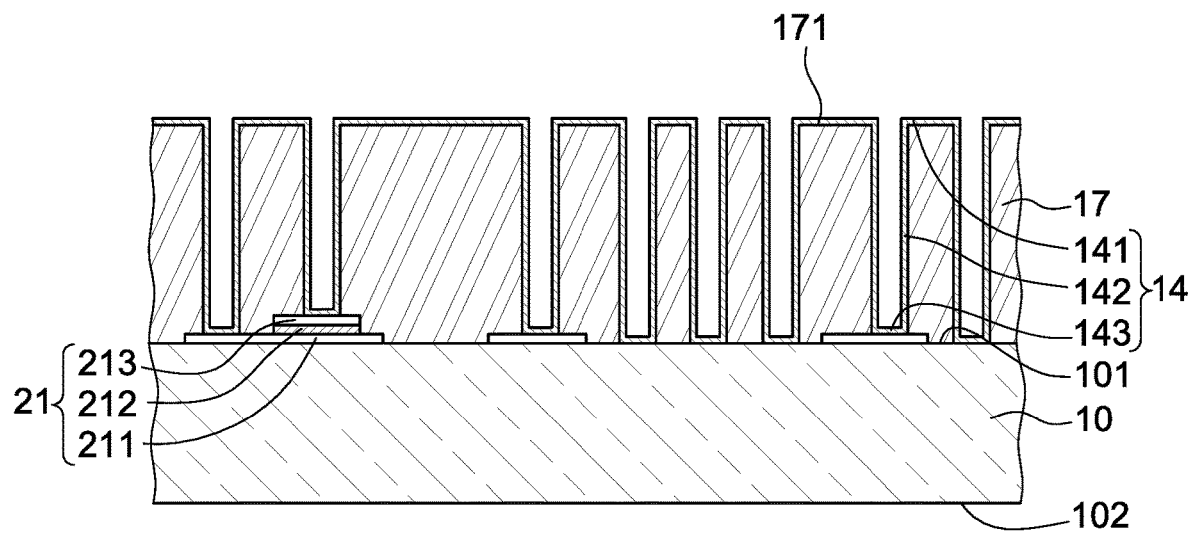

Referring to FIG. 5B, a dielectric layer 17 is formed to cover the patterned conductive layers 211 and 213 and the top surface 101 of the substrate 10. The dielectric layer 17 includes a suitable insulating material. A material of the dielectric layer 17 may be a negative photoresist, and portions of the dielectric layer 17 are removed to define or form openings exposing portions of the patterned conductive layers 211 and 213 and the top surface 101 of the substrate 10. In some embodiments, the dielectric layer 17 is formed by laminating a negative photoresist film having a thickness in a range of about 30 μm to about 100 μm onto the patterned conductive layers 211 and 213 and the substrate 10.

A patterned conductive layer 14 is formed to cover a top surface 171 of the dielectric layer 17, sidewalls of the openings of the dielectric layer 17, and a bottom of the openings corresponding to exposed portions of the patterned conductive layers 211 and 213 and the top surface 101 of the substrate 10. The patterned conductive layer 14 includes a first portion 141, a second portion 142 and a third portion 143. The patterned conductive layer 14 may be or may include a seed layer to allow, for example, subsequent plating.

Figure 5C:
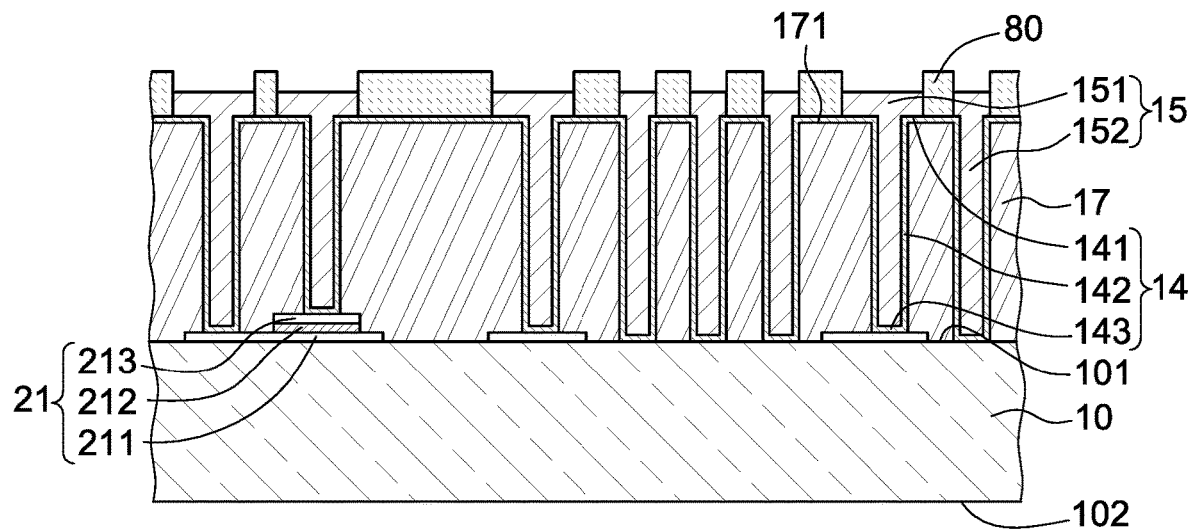

Referring to FIG. 5C, a patterned conductive layer 15 is formed on the patterned conductive layer 14. The patterned conductive layer 15 includes a first portion 151 above the first portion 141 of the patterned conductive layer 14, and includes a second portion 152 below the first portion 141 of the patterned conductive layer 14 and extending into the openings of the dielectric layer 17. A patterned positive photoresist layer 80 is formed on the first portion 141 of the patterned conductive layer 14 to expose portions of the patterned conductive layer 14, and the patterned conductive layer 15 is formed on the exposed portions of the patterned conductive layer 14.

Figure 5D:
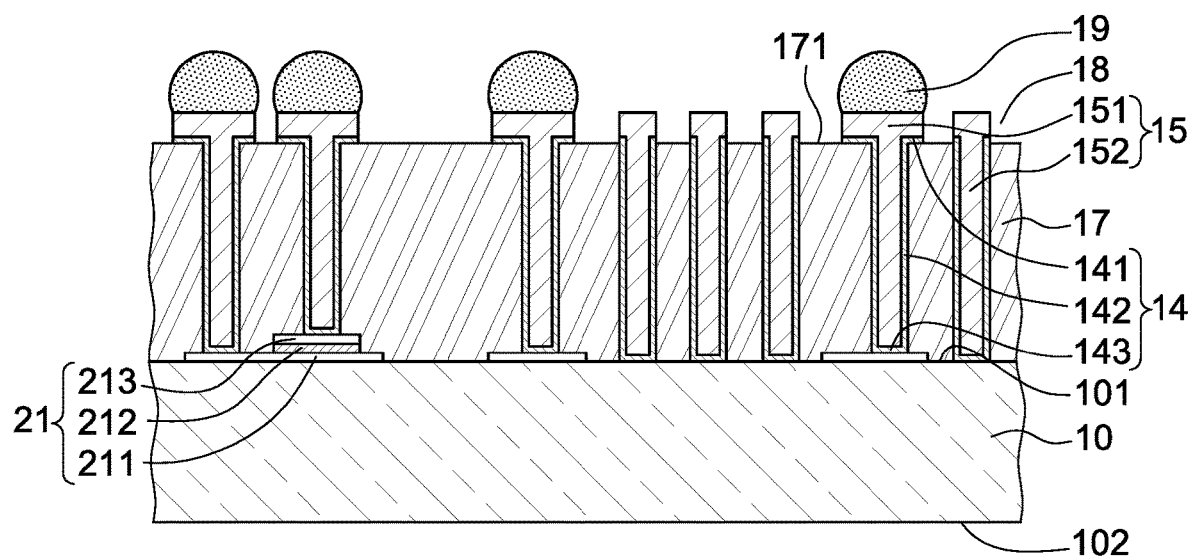

Referring to FIG. 5D, the patterned positive photoresist layer 80 is removed, and portions of the patterned conductive layer 14 (previously covered by the photoresist layer 80) are etched or otherwise removed to expose the top surface 171 of the dielectric layer 17. A connector 19 is formed on the first portion 151 of the patterned conductive layer 15. Next, a solder mask layer 18 (not shown) is formed on the top surface 171 of the dielectric layer 17 and surrounds the first portion 141 of the patterned conductive layer 14 and the first portion 151 of the patterned conductive layer 15. Thus, the semiconductor device package 1 as shown in FIG. 1 is obtained.

Figure 6A:
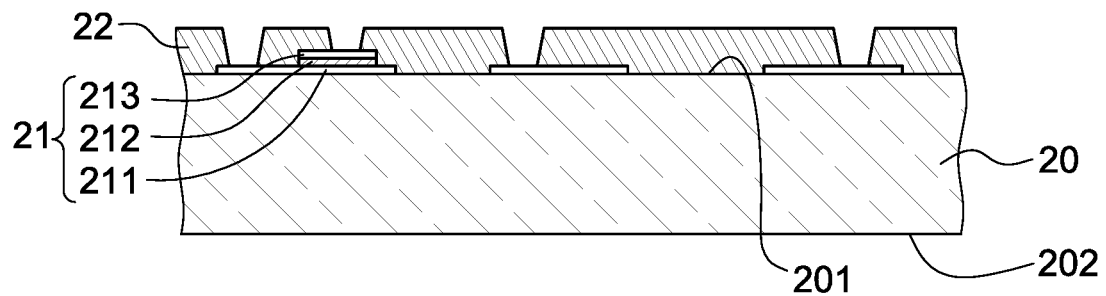
FIG. 6A, FIG. 6B, FIG. 6C, and FIG. 6D illustrate a method of manufacturing a semiconductor device package in accordance with some embodiments of the present disclosure.

FIGS. 6A, 6B, 6C and 6D illustrate a method of manufacturing a semiconductor device package in accordance with some embodiments of the present disclosure. Referring to FIG. 6A, a substrate 20 is provided. In some embodiments, substrate 20 includes one or more of glass, silicon or SiO$_2$. A patterned conductive layer 211 is formed on a top surface 201 of the substrate 20. An insulating layer 212 is formed on a portion of the patterned conductive layer 211. A patterned conductive layer 213 is formed on the insulating layer 212. The insulating layer 212 includes a suitable insulating material. Next, a dielectric layer 22 is formed on the top surface 201 of the substrate 20. Portions of the patterned conductive layers 211 and 213 are exposed by etching.

Figure 6B:
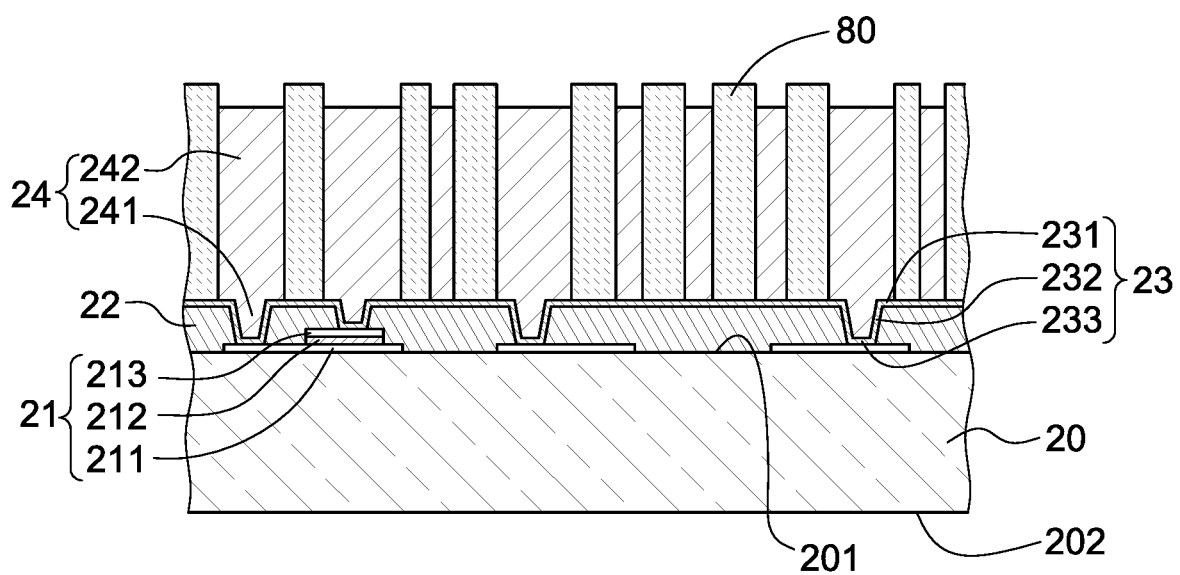

Referring to FIG. 6B, a patterned conductive layer 23 is formed to cover the dielectric layer 22 and the exposed portions of the patterned conductive layers 211 and 213. The patterned conductive layer 23 includes a first portion 231 on the dielectric layer 22, a second portion 232 within the dielectric layer 22 and a third portion 233 within the dielectric layer 22. A patterned conductive layer 24 is formed on the patterned conductive layer 23. The patterned conductive layer 24 includes a first portion 241 and a second portion 242 over the first portion 241. A patterned positive photoresist layer 80 is formed on the first portion 231 of the patterned conductive layer 23 and surrounds the patterned conductive layer 24.

Figure 6C:
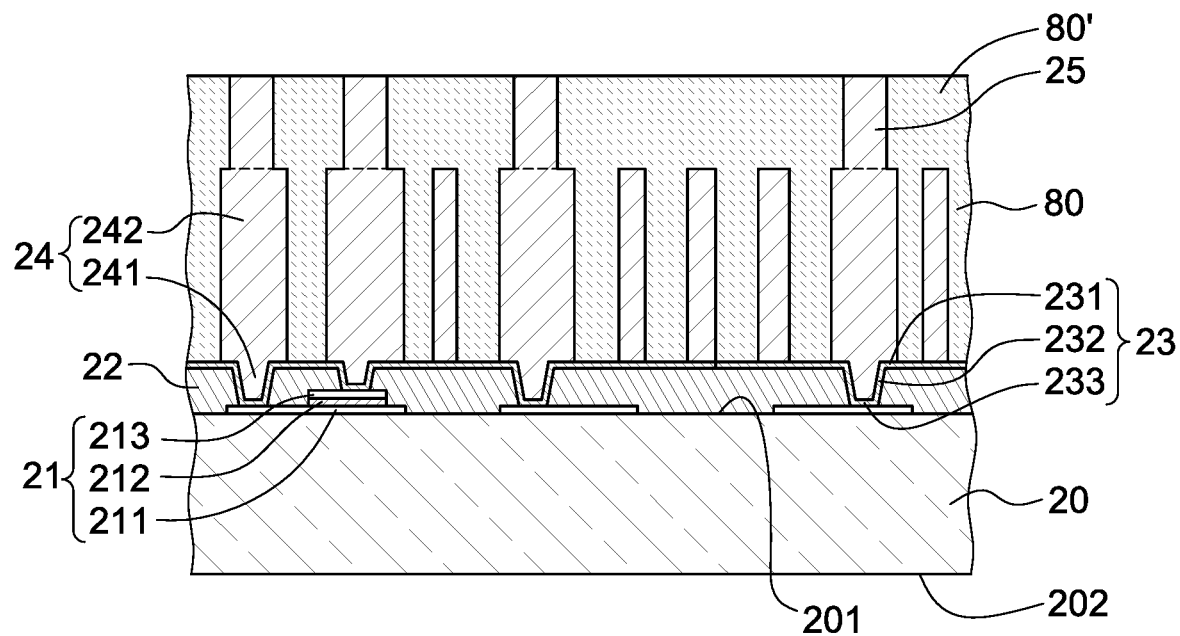

Referring to FIG. 6C, another patterned positive photoresist layer 80' is formed on the patterned positive photoresist layer 80, and defines openings. A patterned conductive layer 25 is formed in the openings and on the patterned conductive layer 24 by, for example, Cu plating.

Figure 6D:
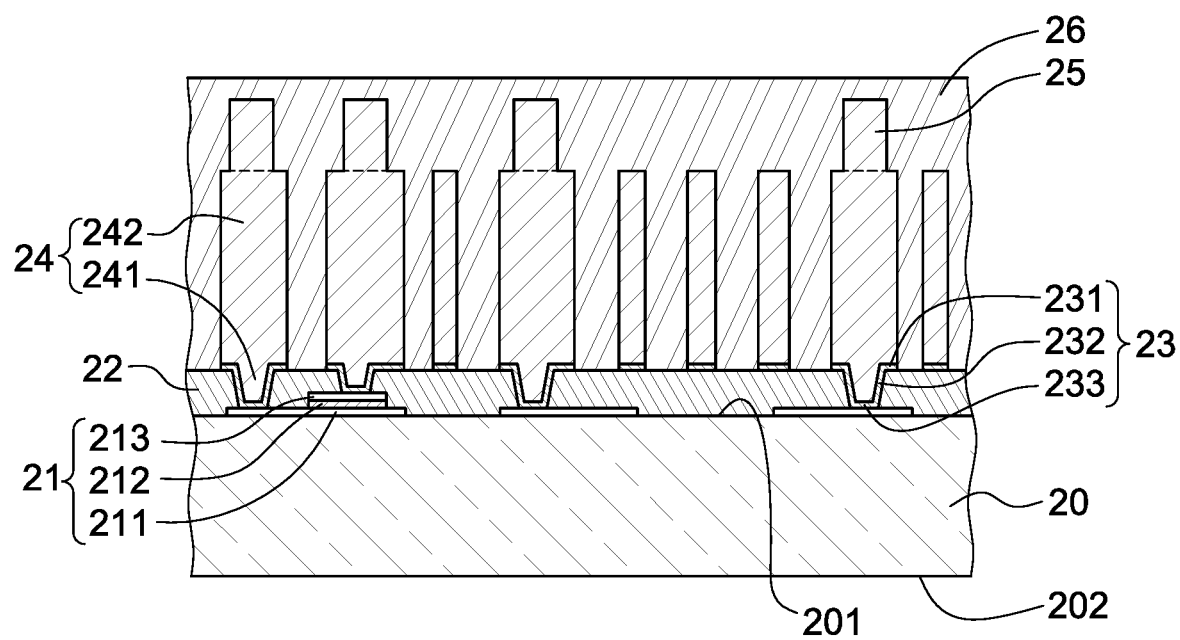

Referring to FIG. 6D, the patterned positive photoresist layers 80 and 80' are removed. Next, an encapsulation layer 26 is formed to surround the first portion 231 of the patterned conductive layer 23, the patterned conductive layer 24 and the patterned conductive layer 25. Next, portions of the encapsulation layer 26 are etched or otherwise removed to expose the patterned conductive layer 25, and connectors 27 are formed on the patterned conductive layer 25. Thus, the semiconductor device package 2 as shown in FIG. 2 is obtained.

Figure 7A:
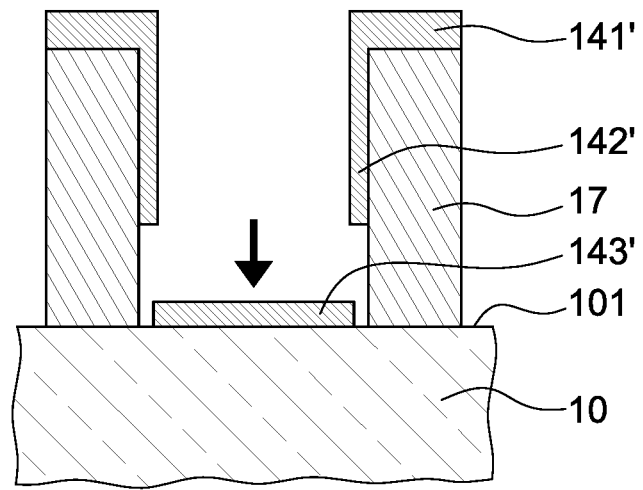
FIG. 7A, FIG. 7B, and FIG. 7C illustrate a method of manufacturing a patterned conductive layer of a semiconductor device package in accordance with some embodiments of the present disclosure.
Figure 7B:
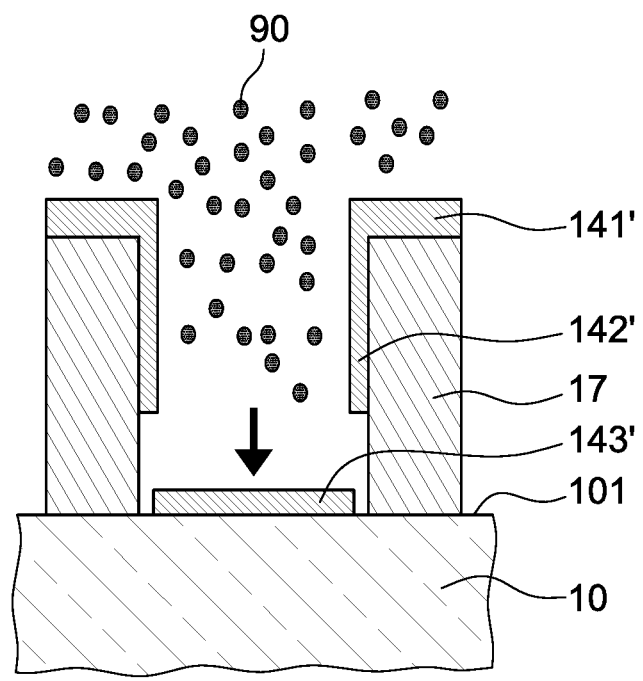
Figure 7C:
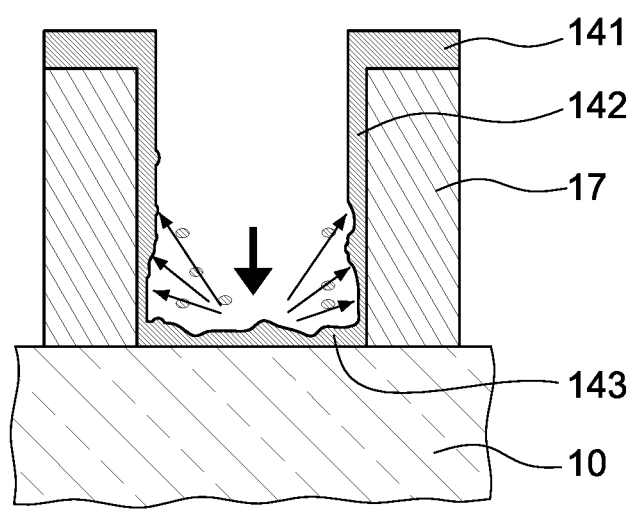

FIG. 7A, FIG. 7B, and FIG. 7C illustrate a method of manufacturing a patterned conductive layer (e.g., a patterned conductive layer 14 as shown in FIG. 1) of a semiconductor device package in accordance with some embodiments of the present disclosure. Referring to FIG. 7A, a first portion 141' of the patterned conductive layer is formed on a top surface of a dielectric layer 17, a second portion 142' of the patterned conductive layer is formed to cover a sidewall of the dielectric layer 17, and a third portion 143' of the patterned conductive layer is formed on a top surface 101 of a substrate 10. The first portion 141' is continuous with the second portion 142' and, at this stage, the second portion 142' is not continuous with the third portion 143'.

Referring to FIG. 7B, an ion bombardment is performed on the first portion 141', the second portion 142' and the third portion 143'. The ion bombardment may be performed by using ionized gas atoms 90 (e.g., $Ar^+$) or other suitable ionized atoms. Referring to FIG. 7C, a portion of a material of the third portion 143' is ejected and re-deposited to attach to the sidewall of the dielectric layer 17. After the ion bombardment, a resulting first portion 141, a resulting second portion 142 and a resulting third portion 143 are continuous with each other.

As used herein, the singular terms "a," "an," and "the" may include plural referents unless the context clearly dictates otherwise.

As used herein, the terms "substantially," "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. In the description of some embodiments, two surfaces can be deemed to be "substantially" coplanar if a displacement between the two surfaces is no greater than 5 µm, no greater than 2 µm, no greater than 1 µm, or no greater than 0.5 µm.

In the description of some embodiments, a component provided "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a substrate having a top surface;
   a first patterned conductive layer on the top surface of the substrate;
   a dielectric layer on the top surface of the substrate and covering the first patterned conductive layer;
   a second patterned conductive layer including a first portion on the dielectric layer, a second portion within the dielectric layer, and a third portion within the dielectric layer and contacting the first patterned conductive layer;
   a third patterned conductive layer on the second patterned conductive layer and having a bottom surface;
   a fourth patterned conductive layer disposed adjacent to the second patterned conductive layer and having a bottom surface, wherein an elevation of the bottom surface of the fourth patterned conductive layer is lower than an elevation of the bottom surface of the third patterned conductive layer, wherein the second patterned conductive layer, the third patterned conductive layer, and the fourth patterned conductive layer form a portion of a 3D inductor structure; and an insulation material on the dielectric layer, wherein a top surface of the insulation material is substantially coplanar with a top surface of the third patterned conductive layer.

2. The semiconductor device package of claim 1, wherein the fourth patterned conductive layer has a width smaller than a width of the third patterned conductive layer.

3. The semiconductor device package of claim 1, wherein the third patterned conductive layer comprises a first portion and a second portion over the first portion, the first portion of the third patterned conductive layer is surrounded by the second patterned conductive layer, and the second portion of the third patterned conductive layer is encapsulated by the insulation material.

4. The semiconductor device package of claim 3, wherein the fourth pattern conductive layer comprises a first portion surrounded by the dielectric layer and a second portion surrounded by the insulation material, wherein a width of the second portion of the fourth pattern conductive layer is smaller than a width of the second portion of the third pattern conductive layer.

5. The semiconductor device package of claim 1, further comprising a fifth patterned conductive layer between the dielectric layer and the fourth patterned conductive layer, wherein the fifth patterned conductive layer contacts the top surface of the substrate.

6. The semiconductor device package of claim 5, wherein the second patterned conductive layer comprises a seed layer, wherein an elevation of a bottom surface of the seed layer is higher than an elevation of a bottom surface of the fifth patterned conductive layer.

7. The semiconductor device package of claim 5, wherein a portion of the fifth patterned conductive layer extends beyond a top end of the fourth patterned conductive layer, and the portion of the fifth patterned conductive layer is surrounded by a solder mask layer.

8. The semiconductor device package of claim 1, wherein the dielectric layer comprises a photoresist.

9. A semiconductor device package, comprising:
a substrate having a top surface;
a first patterned conductive layer on the top surface of the substrate;
a dielectric layer on the top surface of the substrate and covering the first patterned conductive layer;
a second patterned conductive layer including a first portion on the dielectric layer, a second portion within the dielectric layer, and a third portion within the dielectric layer;
a third patterned conductive layer on the second patterned conductive layer;
a fourth patterned conductive layer disposed adjacent to the second patterned conductive layer, penetrating the dielectric layer, and contacting the top surface of the substrate, wherein the second patterned conductive layer, the third patterned conductive layer, and the fourth patterned conductive layer form a portion of a 3D inductor structure; and
an insulation material on the dielectric layer, wherein a top surface of the insulation material is substantially coplanar with a top surface of the third patterned conductive layer.

10. The semiconductor device package of claim 9, wherein the third patterned conductive layer comprises a first portion and a second portion over the first portion, the first portion of the third patterned conductive layer is surrounded by the second patterned conductive layer, and the second portion of the third patterned conductive layer is encapsulated by the insulation material.

11. The semiconductor device package of claim 9, wherein the fourth patterned conductive layer does not contact the first patterned conductive layer.

12. The semiconductor device package of claim 9, wherein the dielectric layer comprises a photoresist.

13. The semiconductor device package of claim 9, wherein the dielectric layer comprises a first via accommodating a portion of the second patterned conductive layer and a second via accommodating a portion of the fourth patterned conductive layer, wherein a depth of the first via is less than a depth of the second via.

14. The semiconductor device package of claim 13, further comprising a passive component disposed within the dielectric layer, wherein the dielectric layer further comprises a third via extended from a top surface of the dielectric layer to the passive component, wherein a depth of the third via is less than a depth of the first via or the second via.

* * * * *